United States Patent
Akasaka et al.

(10) Patent No.: US 9,564,360 B2
(45) Date of Patent: Feb. 7, 2017

(54) SUBSTRATE PROCESSING METHOD AND METHOD OF MANUFACTURING SEMICONDUCTOR DEVICE

(71) Applicant: CANON ANELVA CORPORATION, Kawasaki-shi (JP)

(72) Inventors: Hiroshi Akasaka, Kawasaki (JP); Masayoshi Ikeda, Kawasaki (JP); Kazuhiro Kimura, Kawasaki (JP); Yasushi Kamiya, Kawasaki (JP); Tomohiko Toyosato, Kawasaki (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 0 days.

(21) Appl. No.: 15/164,625

(22) Filed: May 25, 2016

(65) Prior Publication Data
US 2016/0268162 A1    Sep. 15, 2016

Related U.S. Application Data

(63) Continuation of application No. PCT/JP2014/004399, filed on Aug. 27, 2014.

(30) Foreign Application Priority Data

Dec. 25, 2013  (JP) .................................. 2013-267453

(51) Int. Cl.
*H01L 21/768*  (2006.01)
*C23C 14/04*  (2006.01)
*C23C 14/58*  (2006.01)
*H01L 29/66*  (2006.01)
*H01L 29/78*  (2006.01)
*H01L 21/285*  (2006.01)
*C23C 16/56*  (2006.01)

(52) U.S. Cl.
CPC ....... *H01L 21/76865* (2013.01); *C23C 14/046* (2013.01); *C23C 14/5833* (2013.01);
(Continued)

(58) Field of Classification Search
CPC .................. H01L 21/76802; H01L 21/76816; H01L 21/76877; H01L 21/76883
See application file for complete search history.

(56) References Cited

U.S. PATENT DOCUMENTS 5,350,499 A    9/1994  Shibaike et al.
8,198,693 B2   6/2012  Mizuno
(Continued)

FOREIGN PATENT DOCUMENTS

CN    101814520 A    8/2010
JP    61-295629 A    12/1986
(Continued)

OTHER PUBLICATIONS

International Search Report in International Application No. PCT/JP2014/004399 (mailed Dec. 2, 2014).
Office Action in Taiwanese Application No. 103145276 (dated May 4, 2016).

*Primary Examiner* — Jae Lee
(74) *Attorney, Agent, or Firm* — Fitzpatrick, Cella, Harper & Scinto

(57) ABSTRACT

An object of the present invention is to provide a method which enable a material to be fully embedded into a recess portion with a deposition film left in the recess portion. A method in one embodiment comprises: a first irradiation step of irradiating a deposition film formed on an opening portion of a recess portion in a substrate with a particle beam in a direction at a first angle with respect to a substrate in-plane direction, to remove part of the deposition film in a thickness direction; and a second irradiation step of, after the first irradiation step, irradiating the deposition film with the particle beam in a direction at a second angle which is closer to perpendicular to the substrate in-plane direction than the first angle is, to remove part of the remaining deposition film in the thickness direction.

17 Claims, 10 Drawing Sheets

(52) U.S. Cl.
CPC .... *H01L 21/2855* (2013.01); *H01L 21/28556* (2013.01); *H01L 21/76802* (2013.01); *H01L 21/76843* (2013.01); *H01L 21/76862* (2013.01); *H01L 21/76877* (2013.01); *H01L 29/66545* (2013.01); *H01L 29/7843* (2013.01); *C23C 14/5873* (2013.01); *C23C 16/56* (2013.01)

(56) References Cited

U.S. PATENT DOCUMENTS

| | | | |
|---|---|---|---|
| 8,435,727 | B2 | 5/2013 | Godet et al. |
| 9,340,877 | B2 | 5/2016 | Godet et al. |
| 2003/0073314 | A1* | 4/2003 | Skinner ............ H01L 21/02063 438/689 |
| 2012/0306026 | A1 | 12/2012 | Guo et al. |

FOREIGN PATENT DOCUMENTS

| | | |
|---|---|---|
| JP | 2-91940 A | 3/1990 |
| JP | 3-268332 A | 11/1991 |
| JP | 4-128394 A | 4/1992 |
| JP | 2000-307002 A | 11/2000 |
| JP | 2002-158211 A | 5/2002 |
| JP | 2005-327873 A | 11/2005 |
| TW | 201229692 A1 | 7/2012 |
| WO | 2015/097942 A1 | 7/2015 |

\* cited by examiner

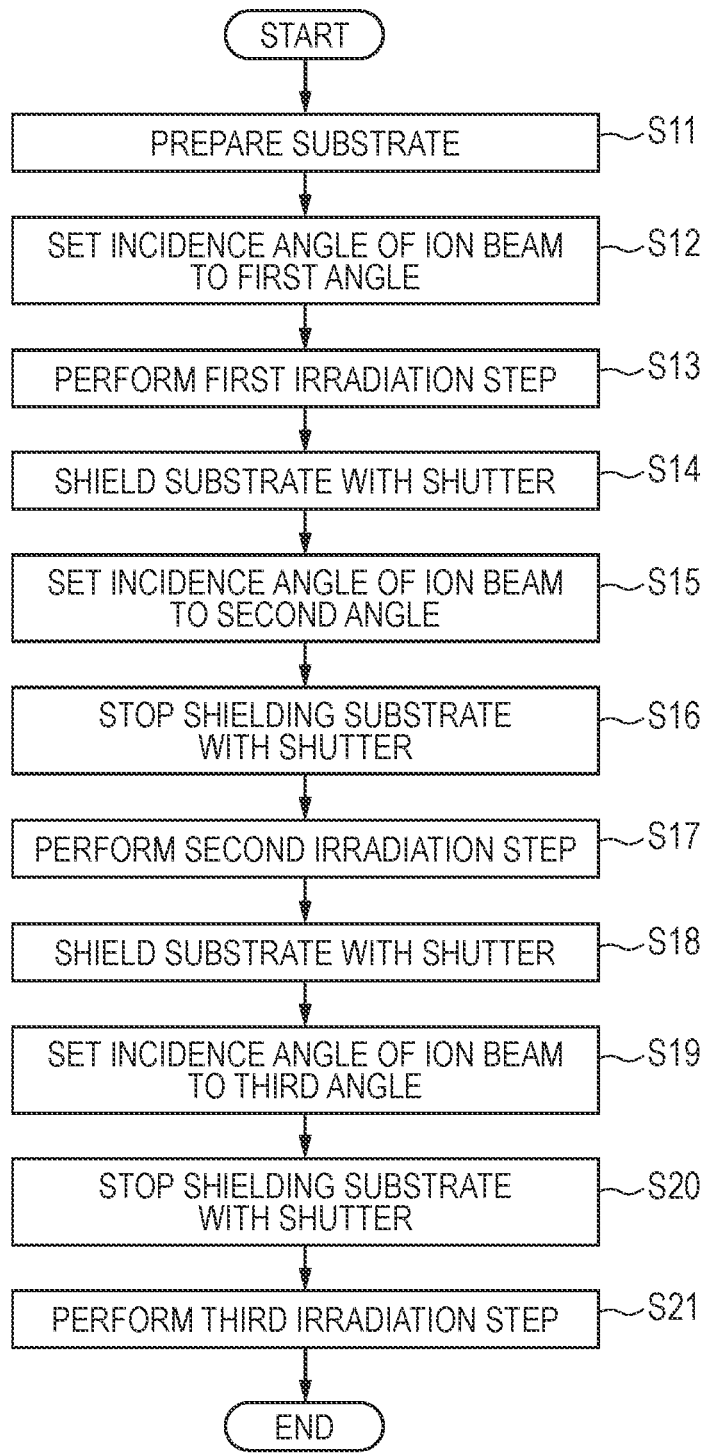

SUBSTRATE PROCESSING METHOD AND METHOD OF MANUFACTURING SEMICONDUCTOR DEVICE

CROSS-REFERENCES TO RELATED APPLICATIONS

This application is a continuation application of International Application No. PCT/JP2014/004399, filed Aug. 27, 2014, which claims the benefit of Japanese Patent Application No. 2013-267453 filed Dec. 25, 2013. The contents of the aforementioned applications are incorporated herein by reference in their entireties.

TECHNICAL FIELD

The present invention relates to a substrate processing method and a method of manufacturing a semiconductor device.

BACKGROUND ART

A substrate in which a stacked film is formed is subjected to etching processing to form recess portions such as through-holes and via holes on the substrate. A conductive material or the like is embedded into the recess portions formed as described above to connect wiring layers located on and below the stacked film to each other or to connect a conductive pattern formed in a wiring layer and an element formed on a semiconductor substrate.

In order to increase the density of elements, prepared are fine recess portions filled with the conductive material. However, in this case, the conductive material may not be fully embedded into the fine recess portions, and may form air holes (also referred to as voids) and cause disconnection in some cases. Patent Document 1 discloses a method of manufacturing a semiconductor device with high yield by fully embedding metal into recess portions on an insulating film and suppressing formation of voids and disconnection of the metal. Specifically, Patent Document 1 discloses a method in which the recess portions formed in the insulating film are irradiated with ion beams in a direction oblique to the substrate and end portions of the insulating film around upper portions of the recess portions are thereby removed by etching. As a result, corners of the end portions are smoothed, and this facilitates subsequent embedding of the metal into the recess portions.

CITATION LIST

Patent Document

Patent Document 1: Japanese Patent Application Laid-Open No. 2000-307002

SUMMARY OF INVENTION

In recent years, with a progress in a finer design of a semiconductor device, a wiring structure of the semiconductor device is also becoming finer. A fine wiring structure has a problem that a wiring material, in particular, diffuses into the interlayer insulating film due to electromigration with application of voltage to the wiring material, and thereby causes disconnection in some cases. A method of forming a conductive film with a barrier property such as titanium nitride between the interlayer insulating film and the wiring material on the substrate is generally known as a method of suppressing the disconnection by electromigration.

Meanwhile, in the method disclosed in Patent Document 1, no consideration is given on the conductive film with the barrier property. If the method of the Patent Document 1 is applied after the conductive film with the barrier property is formed on the substrate, there is a risk that the conductive film is removed by the ion beam and inner wall surfaces of the recess positions are exposed. In order to suppress electromigration, the conductive film with the barrier property needs to be deposited again on the exposed inner wall surfaces. Moreover, the method of the Patent Document 1 has a problem that, due to the deposition of the conductive film performed again, the conductive film deposited in the bottom portions of the recess portions becomes thick and the wiring cannot have sufficiently low resistance.

The present invention has been made in view of the technical problems described above, and an object thereof is to provide a substrate processing method and a method of manufacturing a semiconductor device which enable a material to be fully embedded into a recess portion forming a through-hole, a via hole, or the like with a deposition film left in a bottom portion, a side wall portion, and an upper end portion of the recess portion.

A first aspect of the present invention is a substrate processing method of a substrate which has a recess portion on a surface and in which a deposition film is formed on an opening portion of the recess portion, comprising; a first irradiation step of irradiating the deposition film formed on the opening portion with a particle beam in a direction which forms a first angle with a direction perpendicular to an in-plane direction of the substrate, to remove part of the deposition film in a thickness direction; and a second irradiation step of, after the first irradiation step, irradiating the deposition film formed on the opening portion with the particle beam in a direction which is closer to perpendicular to the in-plane direction of the substrate than the first angle is and which forms a second angle with the direction perpendicular to the in-plane direction of the substrate, to remove part of the remaining deposition film in the thickness direction.

A second aspect of the present invention is a method of manufacturing a semiconductor device including a substrate which has a recess portion on a surface and in which a deposition film is formed on an opening portion of the recess portion, the method comprising: a first irradiation step of irradiating the deposition film formed on the opening portion with a particle beam in a direction which forms a first angle with a direction perpendicular to an in-plane direction of the substrate, to remove part of the deposition film in a thickness direction; and a second irradiation step of, after the first irradiation step, irradiating the deposition film formed on the opening portion with the particle beam in a direction which is closer to perpendicular to the in-plane direction of the substrate than the first angle is and which forms a second angle with the direction perpendicular to the in-plane direction of the substrate, to remove part of the remaining deposition film in the thickness direction.

In the substrate processing method and the method of manufacturing a semiconductor device of the present invention, the first irradiation step of irradiating the deposition film with the particle beam in the direction forming the first angle with respect to the substrate is performed and then the second irradiation step of irradiating the deposition film with the particle beam in the direction forming the second angle which is closer to perpendicular to the substrate is performed. Accordingly, it is possible to effectively remove the deposition film formed on the opening portion of the recess portion while suppressing removal of the deposition film formed on a bottom portion, a side wall portion, and an upper end portion of the recess portion.

BRIEF DESCRIPTION OF DRAWINGS

FIG. 13 is a view illustrating a flowchart of a substrate processing method in one embodiment of the present invention.

DESCRIPTION OF EMBODIMENTS

Figure 1:
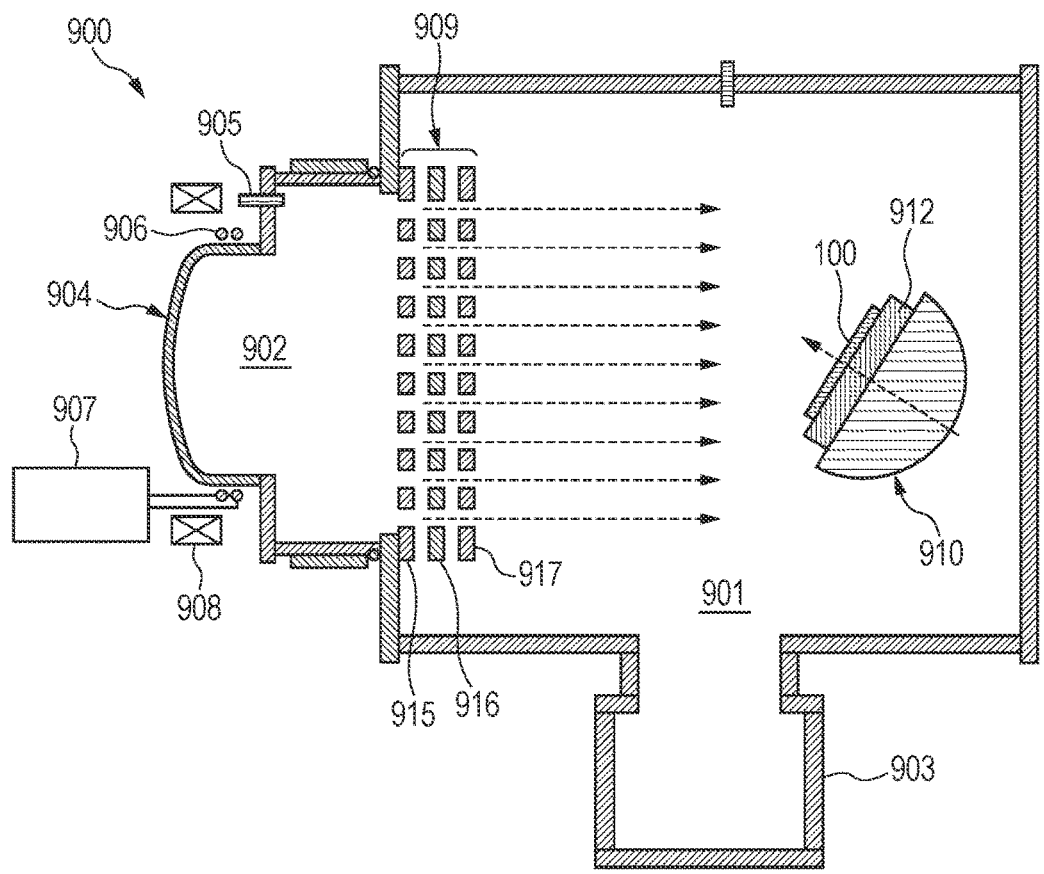
FIG. 1 is a schematic configuration diagram of a substrate processing apparatus in one embodiment of the present invention.

Although embodiments of the present invention are described below with reference to the drawings, the present invention is not limited to the embodiment. Note that, in the drawings described below, parts having the same function are denoted by the same reference numeral and overlapping description thereof is omitted in some cases.

The present invention can be preferably applied to a substrate processing method including a process of forming through holes, via holes, or contact wiring by embedding a conductive material into a recess portion as well as a gate electrode formation process for a transistor and the like. The present invention can be also preferably applied to a method of manufacturing a semiconductor device including any of the processes described above.

First Embodiment

FIG. 1 is a schematic configuration diagram of a substrate processing apparatus 900 in the embodiment. The substrate processing apparatus 900 has an ion generation chamber 902 and a processing chamber 901. The ion generation chamber 902 includes: a bell jar 904 (electric discharge container) forming at least part of the ion generation chamber 902; and a gas introduction portion 905 for introducing gas into the ion generation chamber 902, as plasma forming means for forming plasma. An antenna 906 including a conductive member for generating an induced magnetic field in the bell jar 904 is installed around the bell jar 904. Furthermore, an electric power supplying portion 907 and an electromagnetic coil 908 are installed outside the bell jar 904. The electric power supplying portion 907 includes an electric discharge power supply and a matching circuit which supply high-frequency power (source power) to the antenna 906. The bell jar 904 is part of a chamber outer wall which maintains a vacuum inside the ion generation chamber 902 and the processing chamber 901 and is also a container which stores plasma formed by electric discharge. Plasma is formed inside the bell jar 904 and the ion generation chamber 902 by supplying the gas from the gas introduction portion 905 into the ion generation chamber 902 and supplying the high-frequency power from the electric power supplying portion 907 to the antenna 906.

The processing chamber 901 includes a substrate holder 910 and a vacuum pump 903. The substrate holder 910 has a substrate holding surface 912 for holding a substrate 100 which is a target of processing. Moreover, the vacuum pump 903 is configured to exhaust gas inside the ion generation chamber 902 and the processing chamber 901 and maintain a vacuum thereinside. A not-illustrated ESC (Electrostatic Chuck) electrode is connected to the substrate holder 910. The ESC electrode is used to fix the substrate 100 placed on the substrate holder 910 by means of electrostatic adhesion. The substrate holder 910 only needs to have a function of fixing the substrate, and does not have to be a holder utilizing electrostatic adhesion achieved by the ESC electrode. For example, various substrate fixing methods such as one using a clamp chuck can be used. The substrate holder 910 is configured to be capable of inclining the substrate 100 with respect to an incident direction of an ion beam and rotating the substrate 100 in an in-plane direction by using a not-illustrated drive unit.

An electrode assembly 909 having ion passing holes for extracting ions is provided at a boundary between the ion generation chamber 902 and the processing chamber 901. The electrode assembly 909 includes three plate-shaped electrodes 915, 916, 917 arranged parallel to one another, and hole portions to be the ion passing holes are formed in each of the plate-shaped electrodes 915, 916, 917. The multiple ion passing holes are arranged in horizontal and vertical directions in a grid pattern on each of the plate-shaped electrodes 915, 916, 917. The multiple ion passing holes are formed at the same positions in the plate-shaped electrodes 915, 916, 917. Accordingly, in a state where the plate-shaped electrodes 915, 916, 917 are stacked, the ion passing holes in the plate-shaped electrodes 915, 916, 917 are aligned with one another, and ions can travel between the ion generation chamber 902 and the processing chamber 901 through the ion passing holes of the plate-shaped electrodes 915, 916, 917.

The electrode assembly 909 has the first electrode 915, the second electrode 916, and the third electrode 917 provided in this order from the ion generation chamber 902 side toward the processing chamber 901 side. Specifically, the first electrode 915 is arranged closest to the ion generation chamber, i.e. an ion source, and the second electrode 916 is arranged adjacent to the first electrode 915, closer to the processing chamber 901 than the first electrode 915 is. Moreover, the third electrode 917 is arranged closest to the processing chamber 901. Separate voltage sources are connected respectively to the first electrode 915 and the second electrode 916. A positive voltage is applied to the first electrode 915 while a negative voltage is applied to the second electrode 916. This generates a potential difference between the first electrode 915 and the second electrode 916 for accelerating the ions. The third electrode 917 is electrically grounded. By controlling a potential difference between the second electrode 916 and the third electrode 917, a diameter of an ion beam can be controlled to be within a certain numerical range by means of the electrostatic lens effect.

An operation of ion beam irradiation using the substrate processing apparatus 900 is described. First, a process gas including inert gas such as argon (AR) is introduced into the ion generation chamber 902 from the gas introduction portion 905. Next, the process gas in the ion generation chamber 902 is ionized by applying the high-frequency power from the electric power supplying portion 907 to the antenna 906, and plasma including ions is thereby generated to prepare an ion source. Ions included in the plasma formed in the ion generation chamber 902 are accelerated by the potential difference provided between the first electrode 915 and the second electrode 916, when passing through the many ion passing holes provided in the electrode assembly 909. Then the ions are extracted out to the processing chamber 901 as an ion beam. After being extracted out to the processing chamber 901, the ion beam is neutralized by a not-illustrated neutralizer provided in the processing chamber 901 and falls on the substrate 100.

Figure 2A:
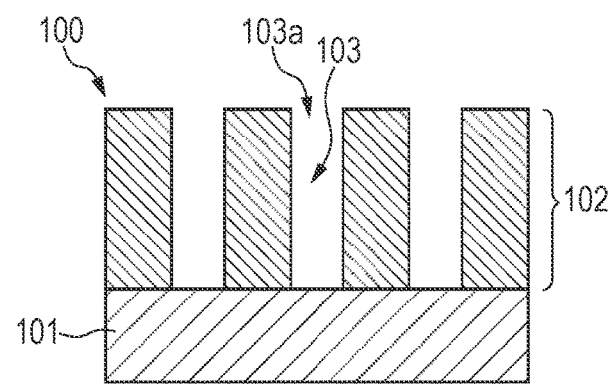
FIG. 2A is a cross-sectional view of a substrate before application of a substrate processing method in one embodiment of the present invention.
Figure 2B:
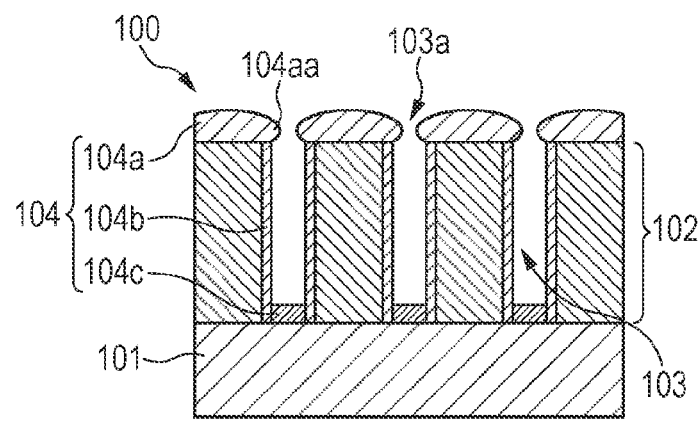
FIG. 2B is a cross-sectional view of the substrate before application of the substrate processing method in one embodiment of the present invention.

FIGS. 2A and 2B are cross-sectional views of the substrate 100 before application of the substrate processing method in the embodiment. As illustrated in FIG. 2A, the substrate 100 includes a base 101 and a member 102 provided on the base 101. Multiple recess portions 103 (trenches) are formed in the member 102.

The base 101 and the member 102 can be made of any material. For example, the base 101 is a semiconductor substrate made of silicone or the like or an insulator substrate made of glass or the like, and the member 102 is an insulating film such as an interlayer insulating film or an interlayer insulating film formed on a certain wiring layer. In the case where the recess portions 103 are provided in the base 101, the member 102 corresponds to a portion of the base 101 in a thickness direction in which the recess portions 103 are formed. The recess portions 103 are formed on the surface of the member 102 and are formed by removing the member 102 in the thickness direction. The recess portions 103 have opening portions 103a on the surface of the member 102. The formation of the recess portions 103 can be performed by using any method such as, for example, ion beam etching or reactive ion etching.

As illustrated in FIG. 2B, after the recess portions 103 are formed in the member 102, a deposition film 104 is formed on a surface of the member 102 and on inner wall surfaces of the recess portions 103 which include bottom portions, side wall portions, and upper end portions of the recess portions 103. The deposition film 104 includes an upper deposition film 104a on the surface of the member 102, a side wall deposition film 104b on the side wall portions of the recess portions 103, and a bottom deposition film 104c on the bottom portions of the recess portions 103. The deposition film 104 is a thin film including a metal element, a semiconductor, and any other materials, and is, for example, an Al film, a Ti film, or a TiN film. The formation of the deposition film 104 may be performed by using any method such as, for example, chemical vapor deposition (CVD) or sputtering.

Generally, in the formation of the deposition film 104, material of the film tends to deposit near each of the opening portions 103a of the recess portions 103. Accordingly, there is formed a protruding portion 104aa (also referred to as overhang) in which the upper deposition film 104a protrudes inward (i.e. in a direction toward a space surrounded by the side wall portion of the recess portion 103) from the side wall portion on the opening portion 103a of the recess portion 103. As a result, the opening portion 103a becomes smaller. If a subsequent step of embedding a metal material is performed in this state, the protruding portion 104aa becomes an obstacle and the metal material is not fully embedded into the recess portion 103. Hence, a void is likely to be formed in the recess portion 103. This phenomenon is a problem particularly in processing of the substrate 100 having a fine pattern of recent years. Applying the substrate processing method in the embodiment to such a substrate 100 can effectively reduce the protruding amount of the protruding portion 104aa and suppress formation of a void in the embedding of the metal material into the recess portion 103.

Figure 3A:
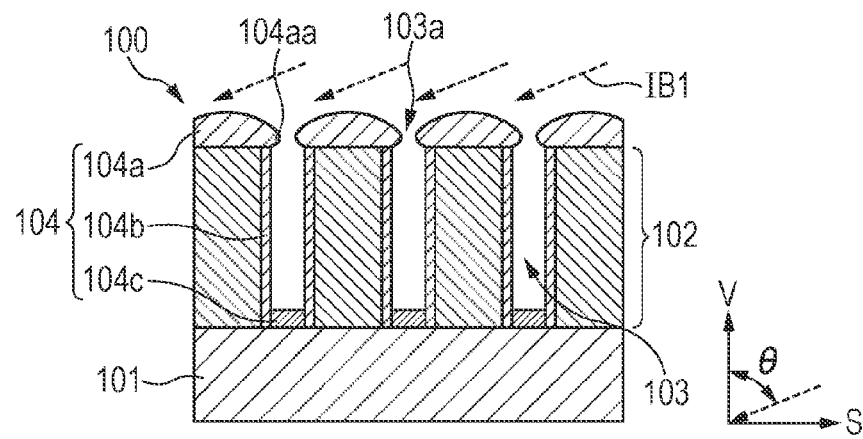
FIG. 3A is a cross-sectional view of the substrate after execution of an irradiation step in one embodiment of the present invention.

The substrate processing method in the embodiment includes a first irradiation step, a second irradiation step, and a third irradiation step. In each of the irradiation steps, the substrate 100 is irradiated with an ion beam under different conditions. The ion beam may be a particle beam including neutral particles. FIG. 3A is a cross-sectional view of the substrate 100 after execution of the first irradiation step. In the first irradiation step, the surface of the substrate 100 on which the recess portions 103 are formed is irradiated with an ion beam IB1 in a direction at a first angle $\theta 1$. The first angle $\theta 1$ is defined as an angle to a direction V (i.e. thickness direction of the substrate 100) perpendicular to the in-plane direction S of the substrate 100. The first angle $\theta 1$ is preferably in a range of more than 40° and less than 90°, more preferably, in a range of 60° or more and 80° or less. An irradiation amount of the bottom deposition film 104c is small in the irradiation with the ion beam IB1 performed at such an angle. Accordingly, the thickness of the protruding portions 104aa in the direction V perpendicular to the in-plane direction S of the substrate 100 can be reduced without greatly removing the bottom deposition film 104c.

Figure 3B:
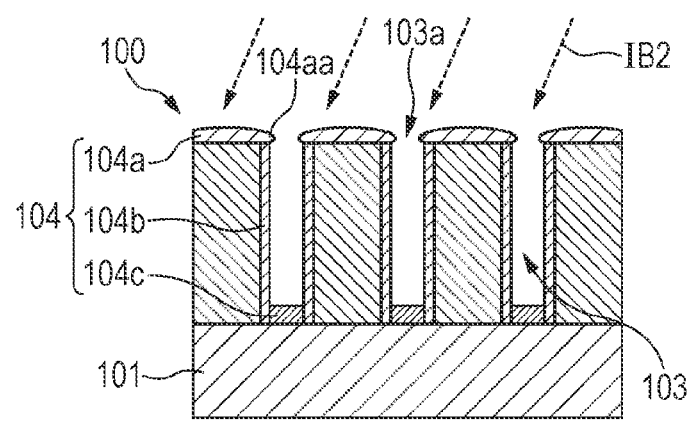
FIG. 3B is a cross-sectional view of the substrate after execution of an irradiation step in one embodiment of the present invention.

FIG. 3B is a cross-sectional view of the substrate 100 after execution of the second irradiation step. In the second irradiation step, the surface of the substrate 100 on which the recess portions 103 are formed is irradiated with an ion beam IB2 in a direction at a second angle θ2 which is smaller than the first angle θ1. The second angle is defined as an angle to the direction V (i.e. thickness direction of the substrate 100) perpendicular to the in-plane direction S of the substrate 100. In other words, the direction of the second angle θ2 is closer to perpendicular to the substrate in-plane direction than the first angle θ1 is. The second angle θ2 is preferably in a range of 0° or more and less than 45°, more preferably, in a range of 0° or more and 20° or less. In the second irradiation step, since the irradiation of IB2 is performed at an angle close to perpendicular to the in-plane direction S of the substrate 100, the protruding portion 104aa can be greatly removed, but at the same time the bottom deposition film 104c is also reduced. However, since the thickness of the protruding portions 104aa in the direction perpendicular to the in-plane direction S of the substrate 100 is already reduced by the first irradiation step, the thickness of the protruding portions 104aa remaining after the first irradiation step in a direction parallel to the in-plane direction S of the substrate 100 can be sufficiently reduced in short time. As a result, the reduction amount of the bottom deposition film 104c can be suppressed.

Figure 3C:
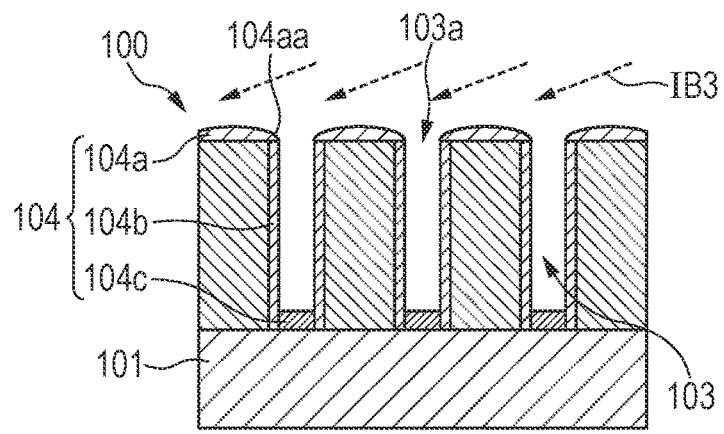
FIG. 3C is a cross-sectional view of the substrate after execution of an irradiation step in one embodiment of the present invention.

FIG. 3C is a cross-sectional view of the substrate 100 after execution of the third irradiation step. In the third irradiation step, the surface of the substrate 100 on which the recess portions 103 are formed is irradiated with an ion beam IB3 in a direction at a third angle θ3 which is greater than the second angle θ2. The third angle θ3 is defined as an angle to the direction V (i.e. thickness direction of the substrate 100) perpendicular to the in-plane direction S of the substrate 100. In other words, the direction of the third angle θ3 is closer to parallel to the substrate in-plane direction than the second angle θ2 is. The third angle θ3 is preferably in a range of more than 40° and less than 90°, more preferably, in a range of 60° or more and 80° or less. The protruding amounts of the protruding portions 104aa toward the insides of the recess portions 103 can be sufficiently reduced by the ion beam IB3.

After the first to third irradiation steps are executed, a metal material such as copper or tungsten is embedded into the recess portions 103 by sputtering. Since the protruding amounts of the protruding portions 104aa toward the insides of the recess portions 103 are reduced by the first to third irradiation steps, formation of void in the recess portions 103 due to the embedding of the metal material can be suppressed.

If the irradiation with the ion beam is performed only at the first angle θ1 close to parallel to the in-plane direction S of the substrate 100, the side wall deposition film 104b near the opening portions 103a is greatly removed in addition to the protruding portions 104aa. Accordingly, the side wall portions of the recess portions 103 may be exposed before the protruding amounts of the protruding portions 104aa toward the insides of the recess portions 103 are sufficiently reduced. Moreover, if the irradiation with the ion beam is performed only at the second angle θ2 close to perpendicular to the in-plane direction S of the substrate 100, the bottom deposition film 104c is greatly removed in addition to the protruding portions 104aa. Accordingly, the bottom portions of the recess portions 103 may be exposed before the protruding amounts of the protruding portions 104aa toward the insides of the recess portions 103 are sufficiently reduced. Meanwhile, in the substrate processing method of the embodiment, the ion beam irradiation at the first angle θ1 close to parallel to the in-plane direction S of the substrate 100 is performed as the first irradiation step and then the ion beam irradiation at the second angle θ2 close to perpendicular to the in-plane direction S of the substrate 100 is performed as the second irradiation step. Accordingly, it is possible to effectively reduce the protruding amounts of the protruding portions 104aa while suppressing removal of the deposition film 104 on the inner wall surfaces of the recess portions 103 other than the protruding portions 104aa, i.e. the deposition film 104 on the bottom portions, the side wall portions, and the upper end portions of the recess portions 103.

Furthermore, the protruding amounts of the protruding portions 104aa can be further reduced by performing the ion beam irradiation at the angle θ3 close to parallel to the in-plane direction S of the substrate 100 as the third irradiation step, after the second irradiation step. As a result, the inner diameters of the holes formed by the protruding portions 104aa can be increased in a view from the upper surface of the substrate 100.

Figure 4:
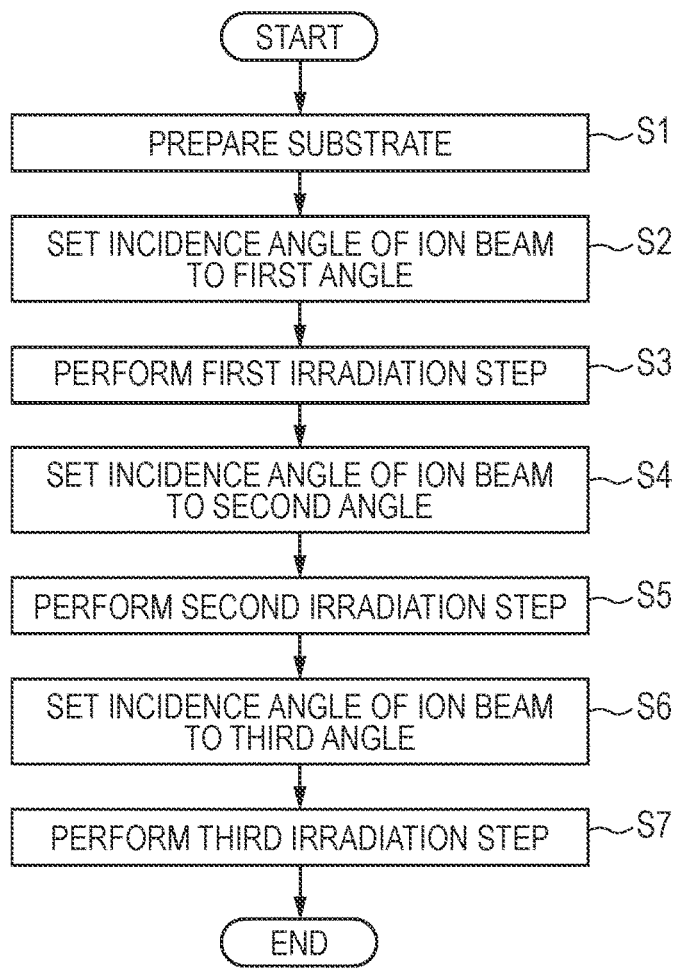
FIG. 4 is a view depicting a flowchart of the substrate processing method in one embodiment of the present invention.

FIG. 4 is a view depicting an example of the flowchart of the substrate processing method in the embodiment. First, the substrate 100 in which the recess portions 103 and the deposition film 104 are formed as in FIG. 2B is prepared as a processing target member and is fixed to the substrate holder 910 of the substrate processing apparatus 900 in FIG. 1 (step S1). Next, the substrate holder 910 is inclined to set the incidence angle of the ion beam from the ion generation chamber 902 on the substrate 100 to the first angle θ1 (step S2). In this state, irradiation of the substrate 100 with the ion beam from the ion generation chamber 902 is performed as the first irradiation step (step S3). During the ion beam irradiation, the substrate 100 is preferably rotated in the in-plane direction by rotating the substrate holder 910. The substrate 100 can be thereby processed evenly in the in-plane direction of the substrate 100. The state of the substrate 100 after step S3 is the state illustrated in FIG. 3A.

Next, the substrate holder 910 is inclined to set the incidence angle of the ion beam from the ion generation chamber 902 on the substrate 100 to the second angle θ2 (step S4). The ion beam irradiation may be stopped or continued while the angle is changed from the first angle θ1 to the second angle θ2. Then, irradiation of the substrate 100 with the ion beam from the ion generation chamber 902 is performed with the incidence angle set to the second angle θ2, as the second irradiation step (step S5). During the ion beam irradiation, the substrate 100 is preferably rotated in the in-plane direction by rotating the substrate holder 910. The substrate 100 can be thereby processed evenly in the in-plane direction of the substrate 100. The state of the substrate 100 after step S5 is the state illustrated in FIG. 3B.

Next, the substrate holder 910 is inclined to set the incidence angle of the ion beam from the ion generation chamber 902 on the substrate 100 to the third angle θ3 (step S6). In this state, irradiation of the substrate 100 with the ion beam from the ion generation chamber 902 is performed as the third irradiation step (step S7). During the ion beam irradiation, the substrate 100 is preferably rotated in the in-plane direction by rotating the substrate holder 910. This enables the processing to be performed evenly in the in-plane direction of the substrate 100. The state of the substrate 100 after step S7 is the state illustrated in FIG. 3C.

Although the angles θ1, θ2, θ3 are defined as the incidence angles of the ion beams on the substrate 100, the angles θ1, θ2, θ3 only need to be defined as the incidence angles of the ion beams on the substrate holding surface 912 in a situation where the substrate 100 is not fixed to the substrate holder 910.

In the embodiment, the substrate (substrate holder 910 in the embodiment) is inclined to change the incidence angle of the ion beam with the ion beam generating means (ion generation chamber 902 and electrode assembly 909 in the embodiment) being fixed. However, the ion beam generating means may be inclined with the substrate being fixed. Moreover, both of the ion beam generating means and the substrate may be inclined.

Examples

Figure 5:
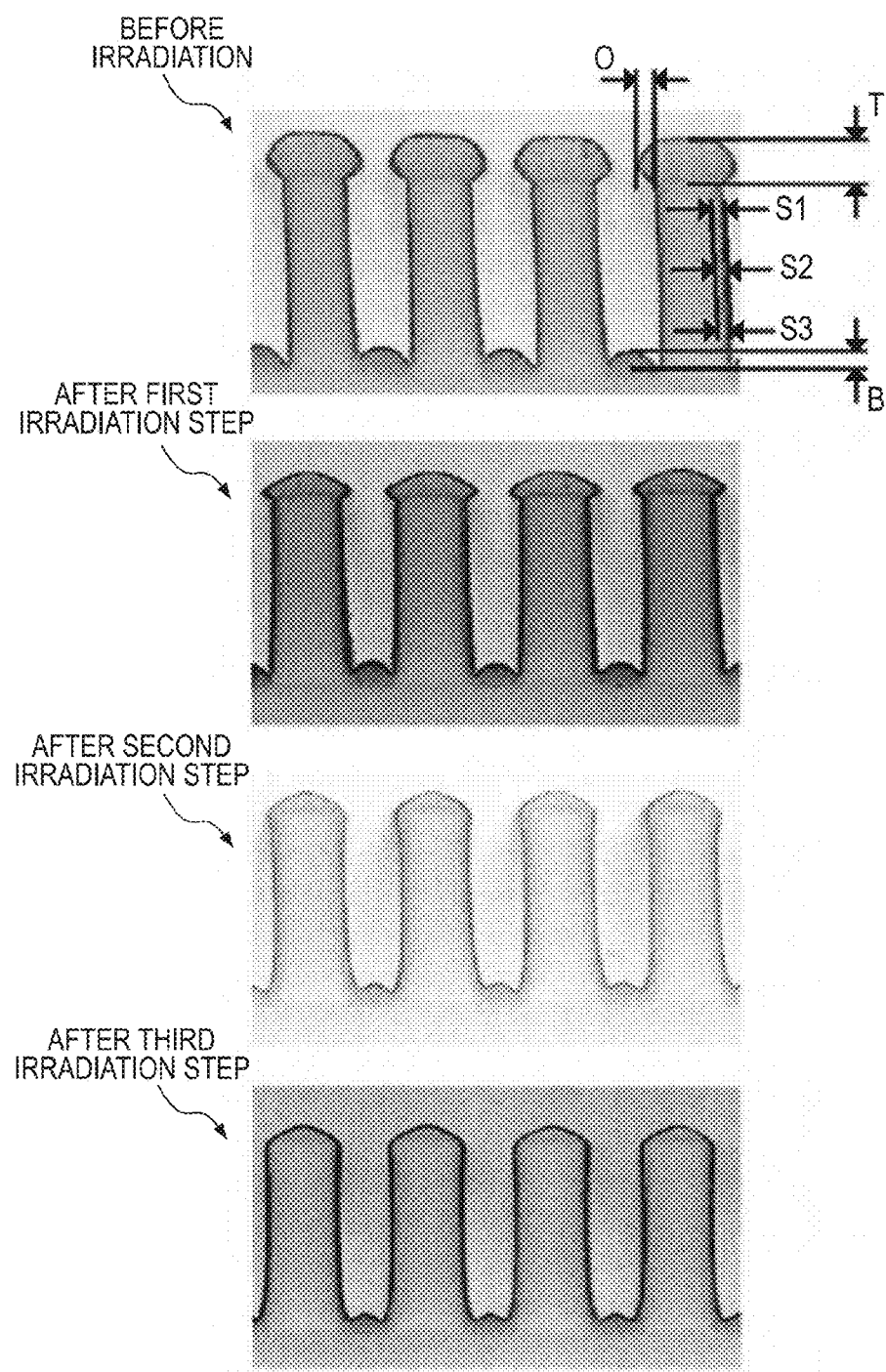
FIG. 5 is a view showing cross-sectional pictures of a substrate subjected to the substrate processing method in one embodiment of the present invention.
Figure 6:
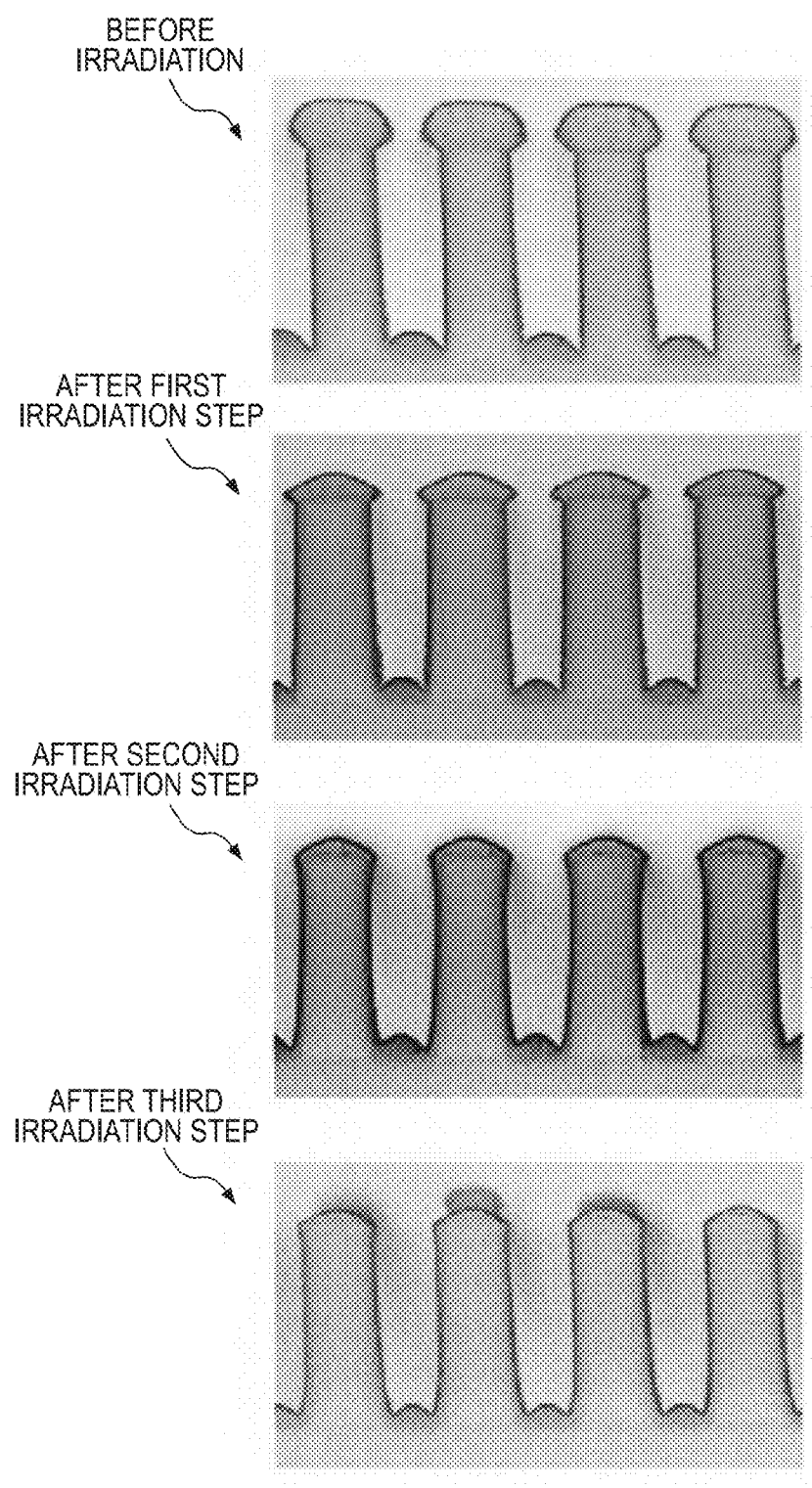
FIG. 6 is a view showing cross-sectional pictures of a substrate subjected to the substrate processing method in one embodiment of the present invention.

FIGS. 5 and 6 are views showing cross-sectional pictures of substrates subjected to the substrate processing method in the first embodiment. The pictures of FIGS. 5 and 6 are cross-sectional images taken by an electron microscope and is subjected to black and white reversal in consideration of visibility. In a sample 1 shown in FIG. 5, the substrate processing method in the first embodiment was performed with the first angle θ1 set to 80°, the second angle θ2 set to 0°, and the third angle θ3 set to 70°. Meanwhile, in a sample 2 shown in FIG. 6, the substrate processing method in the first embodiment was performed with the first angle θ1 set to 80°, the second angle θ2 set to 20°, and the third angle θ3 set to 70°. Thereafter, as shown in FIG. 5, the thickness O by which the protruding portion protrudes toward the inside of the recess portion, the thickness T of the deposition film on the surface of the substrate, the thickness B of the deposition film on a bottom portion of the recess portion, the thickness S1 of the deposition film in an upper portion of the side wall of the recess portion, the thickness S2 in a center portion of the side wall of the recess portion, and the thickness S3 in a lower portion of the side wall of the recess portion were measured for each of the samples. Table 1 depicts the results obtained by measuring the thicknesses for the sample 1. Table 2 depicts the results obtained by measuring the thicknesses for the sample 2. The values of the respective thicknesses in Tables 1 and 2 are expressed as ratios to values thereof before the irradiation, and have no units.

TABLE 1

| Sample 1 | After First Irradiation | After Second Irradiation | After Third Irradiation |
|---|---|---|---|
| O | 0.65 | 0.08 | 0.04 |
| T | 0.55 | 0.42 | 0.36 |
| B | 0.92 | 0.82 | 0.81 |
| S1 | 0.79 | 0.96 | 0.87 |
| S2 | 1.15 | 0.95 | 0.95 |
| S3 | 1.13 | 1.25 | 1.25 |

TABLE 2

| Sample 2 | After First Irradiation | After Second Irradiation | After Third Irradiation |
|---|---|---|---|
| O | 0.65 | 0.29 | 0.06 |
| T | 0.55 | 0.38 | 0.24 |
| B | 0.92 | 0.93 | 0.96 |
| S1 | 0.79 | 1.13 | 0.79 |

TABLE 2-continued

| Sample 2 | After First Irradiation | After Second Irradiation | After Third Irradiation |
|---|---|---|---|
| S2 | 1.15 | 0.65 | 0.80 |
| S3 | 1.13 | 1.29 | 1.25 |

As depicted in Tables 1 and 2, the thickness O by which the protruding portion protrudes toward the inside of the recess portion is significantly reduced by the first to third irradiation steps. However, the change ratios of the thicknesses B, S1, S2, S3 of the deposition film on the inner wall surface of the recess portion are all smaller than that of the thickness O of the protruding portion. Accordingly, it is confirmed that the substrate processing method in the first embodiment can sufficiently reduce the thickness of the protruding portion while leaving the deposition film on all of the bottom portion, the side wall portion, and the upper end portion of the recess portion.

The second angle θ2 is set to 0° in the sample 1 and is set to 20° in the sample 2, and effects of the present invention are sufficiently obtained in both samples. Accordingly, the second angle θ2 is set preferably in the range of 0° or more and less than 45°, more preferably, in the range of 0° or more and 20° or less.

Figure 7:
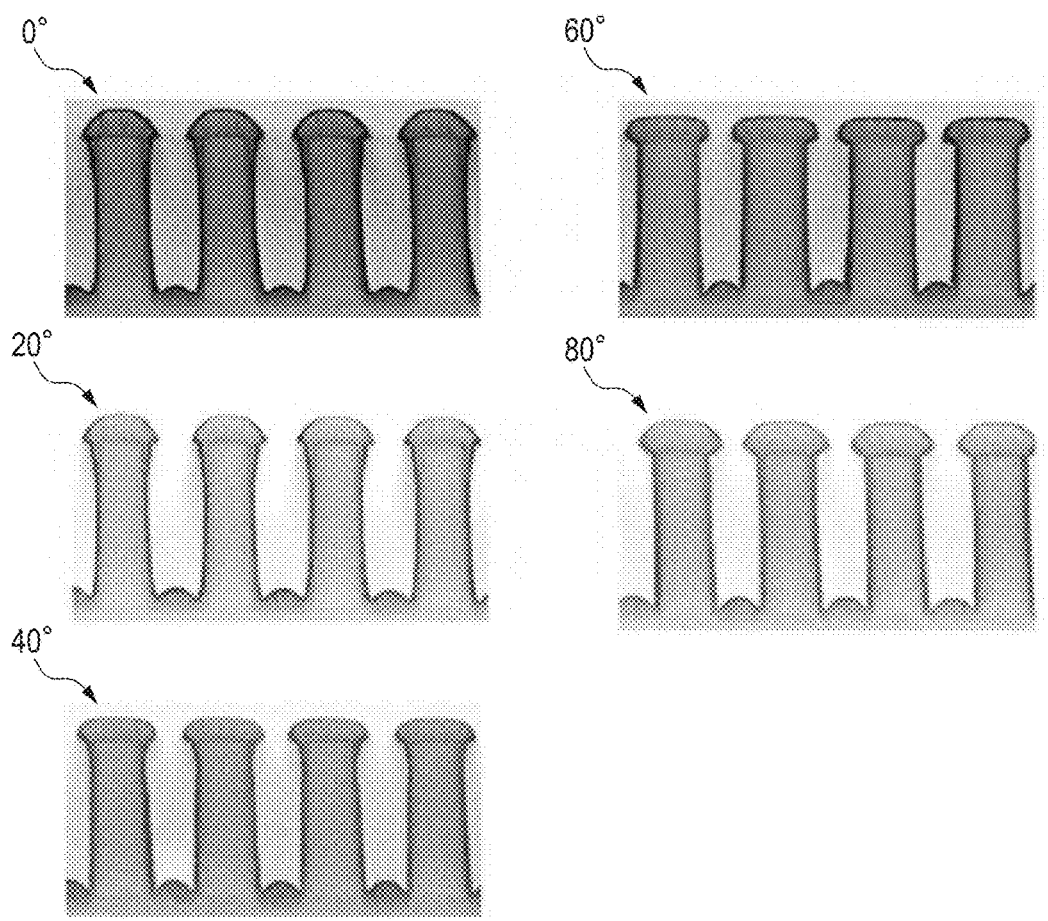
FIG. 7 is a view showing cross-sectional pictures of substrates subjected to the substrate processing method in one embodiment of the present invention.

Further experiments were performed to determine a preferable range of the first angle θ1. FIG. 7 is a view showing cross-sectional pictures of substrates subjected to the first irradiation step in the first embodiment by using various first angles θ1. The pictures in FIG. 7 are cross-sectional images obtained by an electron microscope and are subjected to black and white reversal for the sake of visibility. In FIG. 7, the first irradiation step in the first embodiment was performed with the first angle θ1 set to 0°, 20°, 40°, 60° and 80°, and then the thicknesses O, B, S1, S2, S3 were measured for each of samples. Table 3 depicts the results obtained by measuring the thicknesses for each of the samples. The values of the respective thicknesses in Table 3 are expressed as ratios to values thereof before the irradiation, and have no units.

TABLE 3

|  | 0° | 20° | 40° | 60° | 80° |
|---|---|---|---|---|---|
| O | 0.55 | 0.62 | 0.62 | 0.75 | 0.96 |
| T | 0.73 | 0.71 | 0.63 | 0.65 | 0.85 |
| B | 0.88 | 0.99 | 0.99 | 1.01 | 0.99 |
| S1 | 1.33 | 1.21 | 0.62 | 0.92 | 1.04 |
| S2 | 0.90 | 0.75 | 1.05 | 1.15 | 1.20 |
| S3 | 1.21 | 1.16 | 1.08 | 1.04 | 1.00 |

As depicted in Table 3, the thickness B of the deposition film on the bottom portion of the recess portion is greatly reduced in the sample in which the first angle θ1 is 0°, the thickness S2 of the deposition film in the center portion of the side wall of the recess portion is greatly reduced in the sample in which the first angle θ1 is 20°, and the thickness S1 of the deposition film in the upper portion of the recess portion is greatly reduced in the sample in which the first angle θ1 is 40°. Meanwhile, the change ratios of the thicknesses B, S1, S2, S3 of the deposition film on the inner wall surface of the recess portion are all small in the samples in which the first angle θ1 is 60° and 80°. Accordingly, the first angle θ1 is set preferably in the range of more than 40° and less than 90°, more preferably, in the range of 60° or more and 80° or less.

Second Embodiment

Figure 8:
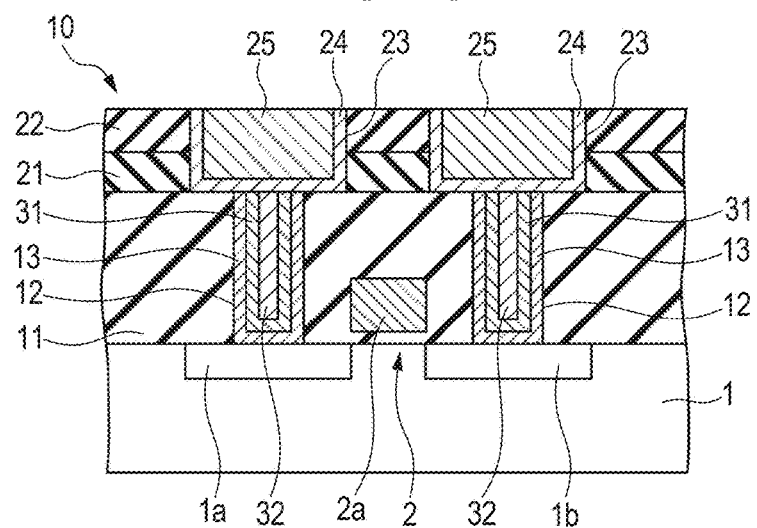
FIG. 8 is a cross-sectional view of a semiconductor device manufactured by a method of manufacturing a semiconductor device in one embodiment of the present invention.

The substrate processing method in the first embodiment can be preferably applied to a case of forming wiring in the recess portions in a method of manufacturing a semiconductor device. FIG. 8 is a cross-sectional view of a semiconductor device 10 manufactured by a method of manufacturing a semiconductor device in the embodiment. The semiconductor device 10 includes a base 1, a metal-oxide-semiconductor field-effect transistor (MOSFET) 2 provided on a surface of the base 1 and including a gate electrode 2a therein, and an interlayer insulating film 11 covering the surface of the base 1 and the MOSFET 2. The base 1 is a semiconductor substrate. Any MOSFET structure can be used as the MOSFET 2. For example, a silicon oxide can be used as the interlayer insulating film 11.

A source region 1a and a drain region 1b are formed near a surface of the base 1 in contact with the MOSFET 2 by implanting impurity ions into the base 1. The source region 1a and the drain region 1b are arranged not to be in contact with each other. Recess portions 12 (trenches) formed by removing the interlayer insulating film 11 in a thickness direction are provided respectively on the source region 1a and the drain region 1b.

An underlying film 13 covering inner wall surfaces of the recess portions 12 and a barrier film 31 covering the underlying film 13 are formed inside the recess portions 12 (i.e. in spaces surrounded by side wall portions of the recess portions 12), and insides of the barrier film 31 are filled with a wiring material 32. The underlying film 13 is a conductive film for improving adhesion between the interlayer insulating film 11 (i.e. the inner wall surfaces of the recess portions 12) and the wiring material 32 and is, for example, a Ti film. The barrier film 31 is a conductive diffusion preventing film for improving a barrier property by suppressing movement of atoms between the interlayer insulating film 11 and the wiring material 32 and is, for example, a TiN film. The wiring material 32 is a conductive material for forming the wiring and is, for example, Cu or W.

A SiN film 21 and a SiO$_2$ film 22 are further formed in this order on the MOSFET 2 and the interlayer insulating film 11. Recess portions 23 (trenches) formed by removing the SiN film 21 and the SiO$_2$ film 22 in the thickness direction are provided respectively on the recess portions 12. A TiN film 24 covering inner wall surfaces of the recess portions 23 are formed inside the recess portions 23 (i.e. in spaces surrounded by side wall portions of the recess portions 23) and insides of the TiN film 24 are filled with a wiring material 25. The wiring material 25 is a conductive material for forming wiring and is, for example, Cu or W.

Figure 9A:
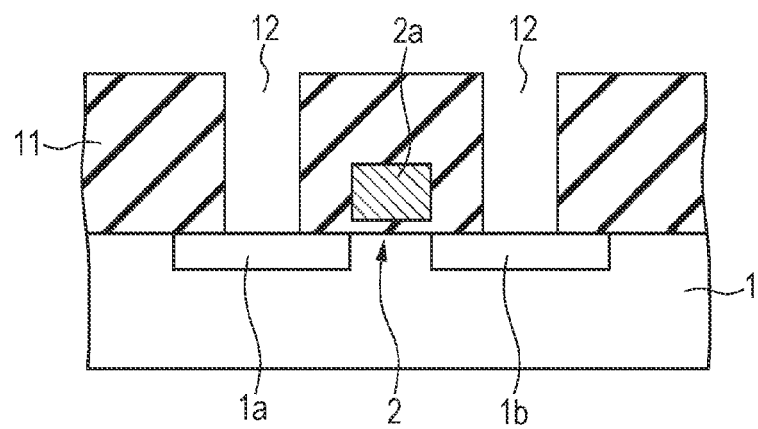
FIG. 9A is a cross-sectional view illustrating a manufacturing step of the semiconductor device in the method of manufacturing a semiconductor device in one embodiment of the present invention.
Figure 9B:
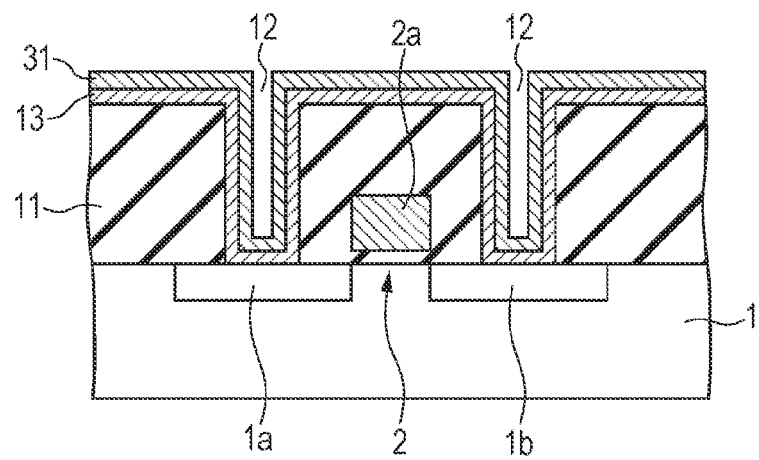
FIG. 9B is a cross-sectional view illustrating a manufacturing step of the semiconductor device in the method of manufacturing a semiconductor device in one embodiment of the present invention.
Figure 9C:
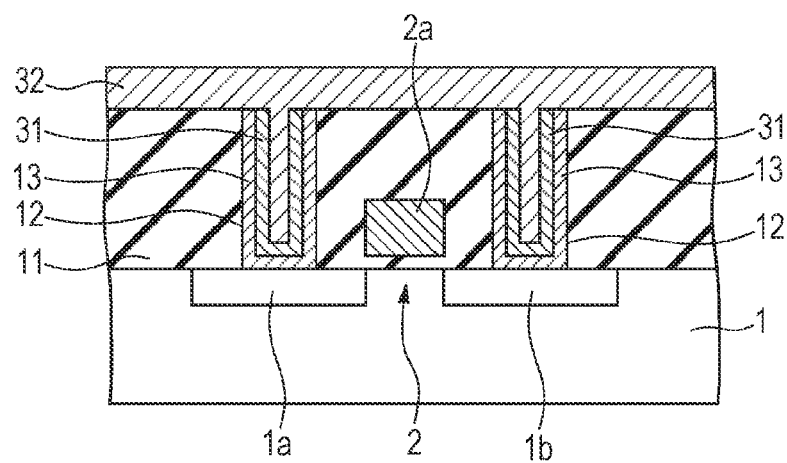
FIG. 9C is a cross-sectional view illustrating a manufacturing step of the semiconductor device in the method of manufacturing a semiconductor device in one embodiment of the present invention.

FIGS. 9A to 9C are cross-sectional views illustrating manufacturing steps of the semiconductor device 10 in the method of manufacturing a semiconductor device in the embodiment. In the method of manufacturing the semiconductor device 10 in the embodiment, first, the source region 1a and the drain region 1b are formed near the surface of the base 1 by implanting impurity ions, and the MOSFET 2 including the gate electrode 2a is formed at a position in contact with the source region 1a and the drain region 1b on the surface of the base 1. Then the interlayer insulating film 11 covering the surface of the base 1 and the side wall of the MOSFET 2 is formed. Next, the recess portions 12 are formed respectively on the source region 1a and the drain region 1b by removing the interlayer insulating film 11 in the thickness direction. The recess portions 12 can be formed by any method. For example, the recess portions 12 can be formed by: forming a pattern by using a photoresist technique; removing the interlayer insulating film 11 by performing etching according to the pattern; and then removing the pattern. FIG. 9A is a cross-sectional view of the semiconductor device 10 in which the recess portions 12 are formed.

Next, the underlying film 13 and the barrier film 31 which cover the surface of the interlayer insulating film 11 and the inner wall surfaces of the recess portions 12 are formed in this order. When the underlying film 13 and the barrier film 31 are deposited, protruding portions having a shape in which the underlying film 13 and the barrier film 31 protrude toward the insides of the recess portions 12 are formed in upper end portions of the recess portions 12. In view of this, in the method of manufacturing the semiconductor device 10 in the embodiment, the substrate processing method in the first embodiment, i.e. the substrate processing method depicted in the flowchart of FIG. 4 is applied to at least one of a first timing after the formation of the underlying film 13 and before the formation of the barrier film 31 and a second timing after the formation of the barrier film 31 and before the filling of the wiring material 32. As a result, it is possible to reduce the protruding amounts of the protruding portions formed inside the recess portions 12 and fully embed the wiring material 32 in the subsequent step. Moreover, since removal of the underlying film 13 and the barrier film 31 which are formed on bottom portions, side wall portions, and upper end portions of the recess portions 12 can suppressed in the substrate processing method in the first embodiment, the barrier property of the underlying film 13 and the barrier film 31 can be maintained.

Performing the substrate processing method in the first embodiment at the first timing is preferable because the removal of the protruding portions of the underlying film 13 can reduce the protruding amounts of the protruding portions in the formation of the barrier film 31 performed after the removal. Moreover, performing the substrate processing method in the first embodiment at both of the first timing and the second timing is more preferable because the protruding amounts of the protruding portions can be further reduced. FIG. 9B is a cross-sectional view of the semiconductor device 10 in which the protruding portions of the underlying film 13 and the barrier film 31 are removed.

Next the underlying film 13 and the barrier film 31 deposited on the surface of the interlayer insulating film 11 outside the recess portions 12 are removed by polishing (for example, the CMP method), and the recess portions 12 are filled with the wiring material 32 by sputtering. FIG. 9C is a cross-sectional view of the semiconductor device 10 in which the recess portions 12 are filled with the wiring material 32.

Thereafter, although not illustrated, the wiring material 32 deposited on the surface of the interlayer insulating film 11 outside the recess portions 12 is removed by polishing, and the SiN film 21, the SiO2 film 22, the recess portions 23, the TiN film 24, and the wiring material 25 are formed on the interlayer insulating film 11. In addition to the steps described above, a step of forming an additional film or a step of removing part or all of a certain film by etching, polishing, or the like may be performed between any of the steps of forming the films and the recess portions included in the semiconductor device 10.

Third Embodiment

Figure 10:
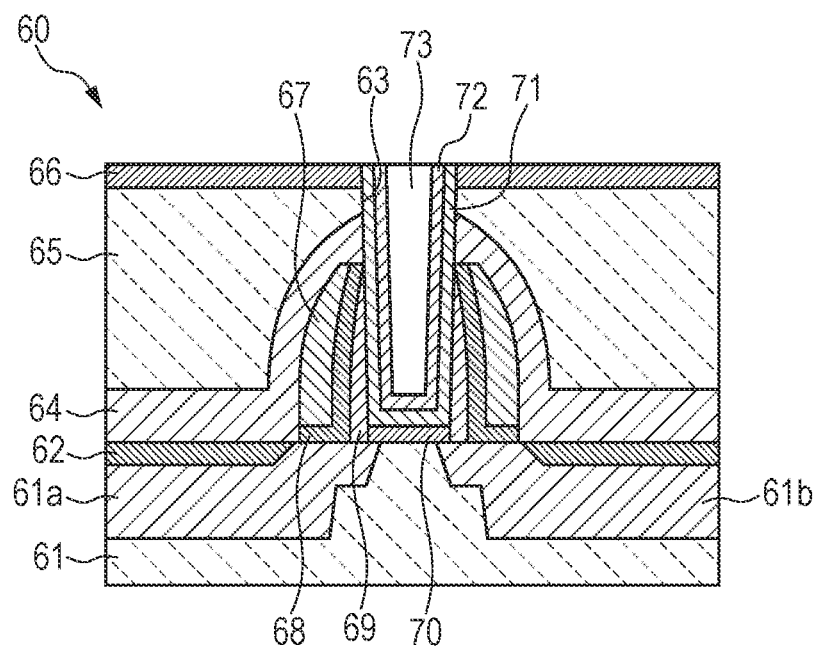
FIG. 10 is a cross-sectional view of a semiconductor device manufactured in a method of manufacturing a semiconductor device in one embodiment of the present invention.

The substrate processing method in the first embodiment can be preferably applied to a case of forming an electrode in a recess portion in a method of manufacturing a semiconductor device. FIG. 10 is a cross-sectional view of a semiconductor device 60 manufactured in a method of manufacturing a semiconductor device in the embodiment. The semiconductor device 60 includes a MOSFET structure formed by a gate-last process. Although the case where a P-type MOSFET structure is used is described below, in the case where an N-type MOSFET structure is used, it is only necessary to interchange the P-type and the N-type in the following description. The semiconductor device 60 includes a base 61 as a P-type impurity region. A source region 61a and a drain region 61b which are N-type impurity regions are formed near a surface of the base 61 by implanting impurity ions into the base 61. The base 61 is a semiconductor substrate. High-melting-point metal silicide regions 62 are formed near surfaces of the source region 61a and the drain region 61b.

A side wall insulating film including a SiN film 69, a SiO$_2$ film 68, and a SiN film 67 are stacked on the source region 61a and the drain region 61b. A stress liner film 64 made of, for example, SiN, an insulating film 65 made of, for example, SiO$_2$, and a stopper film 66 made of, for example, SiN are stacked on the side wall insulating film to cover it. Moreover, there is provided a recess portion (trench) formed by removing the side wall insulating film, the stress liner film 64, the insulating film 65, and the stopper film 66 in a thickness direction. A side wall portion of the recess portion 63 is formed of the stress liner film 64, the insulating film 65, the stopper film 66, and the side wall insulating film including the SiN film 69, the SiO$_2$ film 68, and the SiN film 67.

A gate insulating film 70 is formed on a bottom portion of the recess portion 63. For example, hafnium oxide, hafnium silicon oxide, hafnium silicon oxynitride, or zirconium oxide can be used as the gate insulating film 70. Moreover, there are formed an underlying film 71 covering the side wall portion of the recess portion 63 and a surface of the gate insulating film 70 and made of, for example, Ti and a barrier film 72 covering the underlying film 71 and made of, for example, TiN. An inside of the barrier film 72 is filled with a gate electrode 73. The gate electrode 73 is a conductive material for forming an electrode and is, for example Cu or W.

Figure 11A:
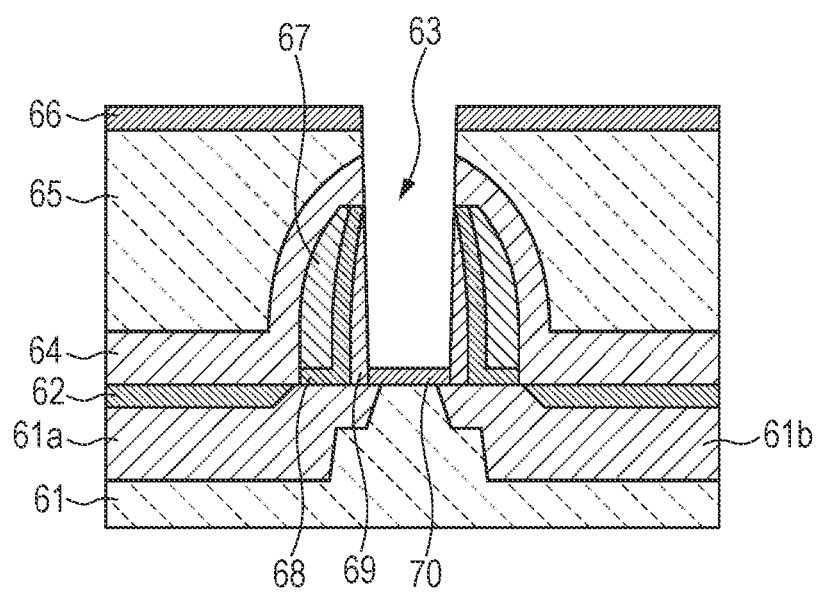
FIG. 11A is a cross-sectional view illustrating a manufacturing step of the semiconductor device in the method of manufacturing a semiconductor device in one embodiment of the present invention.
Figure 11B:
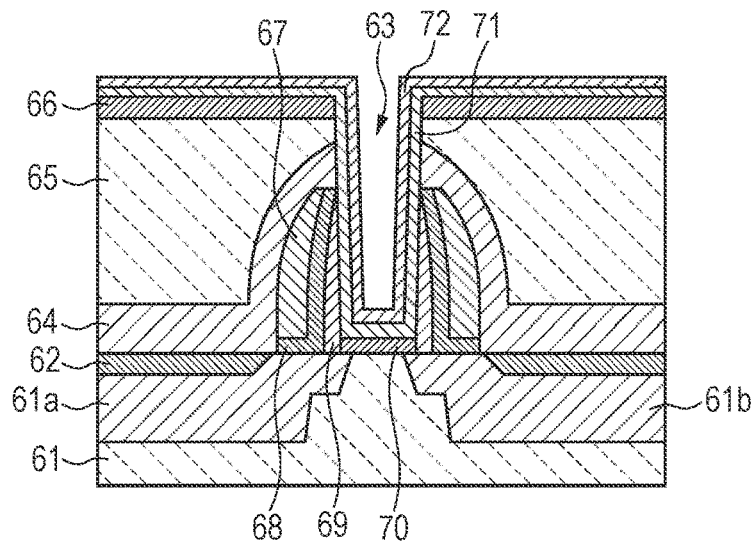
FIG. 11B is a cross-sectional view illustrating a manufacturing step of the semiconductor device in the method of manufacturing a semiconductor device in one embodiment of the present invention.

FIGS. 11A and 11B are cross-sectional views illustrating manufacturing steps of the semiconductor device 60 in the method of manufacturing a semiconductor device in the embodiment. In the method of manufacturing the semiconductor device 60 in the embodiment, first, the gate insulating film 70 is formed on the surface of the base 61. A dummy gate (not illustrated) is preferably provided on the gate insulating film 70 to facilitate film formation performed later. Next, the SiN film 69, the SiO$_2$ film 68, and the SiN film 67 are formed in this order by, for example, a CVD method as the side wall insulating film covering side surfaces of the gate insulating film 70 and the dummy gate.

After the formation of the side wall insulating film, impurity ions are implanted into the surface of the base 61 around the side wall insulating film to form the source region 61a and the drain region 61b. Thereafter, annealing is preferably performed to activate the impurity. Next, a thin layer of high-melting point metal is deposited on the surfaces of the source region 61a and the drain region 61b and annealing is performed to form the high-melting-point metal silicide regions 62. Then, the stress liner film 64, the insulating film 65, and the stopper film 66 are formed in this order by, for example, a CVD method to cover the side wall insulating film, the dummy gate, and the high-melting-point metal silicide regions 62.

Then, the recess portion 63 is formed on the gate insulating film 70 by removing the dummy gate (not illustrated), the stress liner film 64, the insulating film 65, and the stopper film 66 in the thickness direction. The recess portion 63 can be formed by any method. For example, the recess portion 63 can be formed by: forming a pattern by using a photoresist technique; removing the dummy gate, the stress liner film 64, the insulating film 65, and the stopper film 66 by performing etching according to the pattern; and then removing the pattern. FIG. 11A is a cross-sectional view of the semiconductor device 60 in which the recess portion 63 is formed.

Next, the underlying film 71 covering the surface of the stopper film 66 and the inner wall surface of the recess portion 63 and the barrier film 72 are formed in this order. When the underlying film 71 and the barrier film 72 are deposited, a protruding portion having a shape in which the underlying film 71 and the barrier film 72 protrude toward an inside of the recess portion 63 is formed in an upper end portion of the recess portion 63. In view of this, in the method of manufacturing the semiconductor device 60 in the embodiment, the substrate processing method in the first embodiment, i.e. the substrate processing method depicted in the flowchart of FIG. 4 is applied to least at one of a first timing after the formation of the underlying film 71 and before the formation of the barrier film 72 and a second timing after the formation of the barrier film 72 and before the filling of the gate electrode 73. As a result, it is possible to reduce the protruding amount of the protruding portion formed inside the recess portion 63 and fully embed the gate electrode 73 in the subsequent step. Moreover, since removal of the underlying film 71 and the barrier film 72 which are formed on the bottom portion, the side wall portion, and the upper end portion of the recess portion 63 can be suppressed in the substrate processing method in the first embodiment, the barrier property of the underlying film 71 and the barrier film 72 can be maintained.

Performing the substrate processing method in the first embodiment at the first timing is preferable because the removal of the protruding portion of the underlying film 71 can reduce the protruding amount of the protruding portion in the formation of the barrier film 72 performed after the removal. Moreover, performing the substrate processing method in the first embodiment at both of the first timing and the second timing is more preferable because the protruding amount of the protruding portion can be further reduced. FIG. 11B is a cross-sectional view of the semiconductor device 60 in which the protruding portion of the underlying film 71 and the barrier film 72 are removed.

Thereafter, although not illustrated, the recess portion 63 is filled with the gate electrode 73 by sputtering, and the underlying film 71, the barrier film 72, and the gate electrode 73 deposited on the surface of the stopper film 66 outside the recess portion 63 are removed by polishing. The aforementioned cross-sectional view of FIG. 10 illustrates the semiconductor device 60 in this state. In addition to the steps described above, a step of forming an additional film or a step of removing part or all of a certain film by etching, polishing, or the like may be performed between any of the steps of forming the films and the recess portion included in the semiconductor device 60.

Fourth Embodiment

Figure 12:
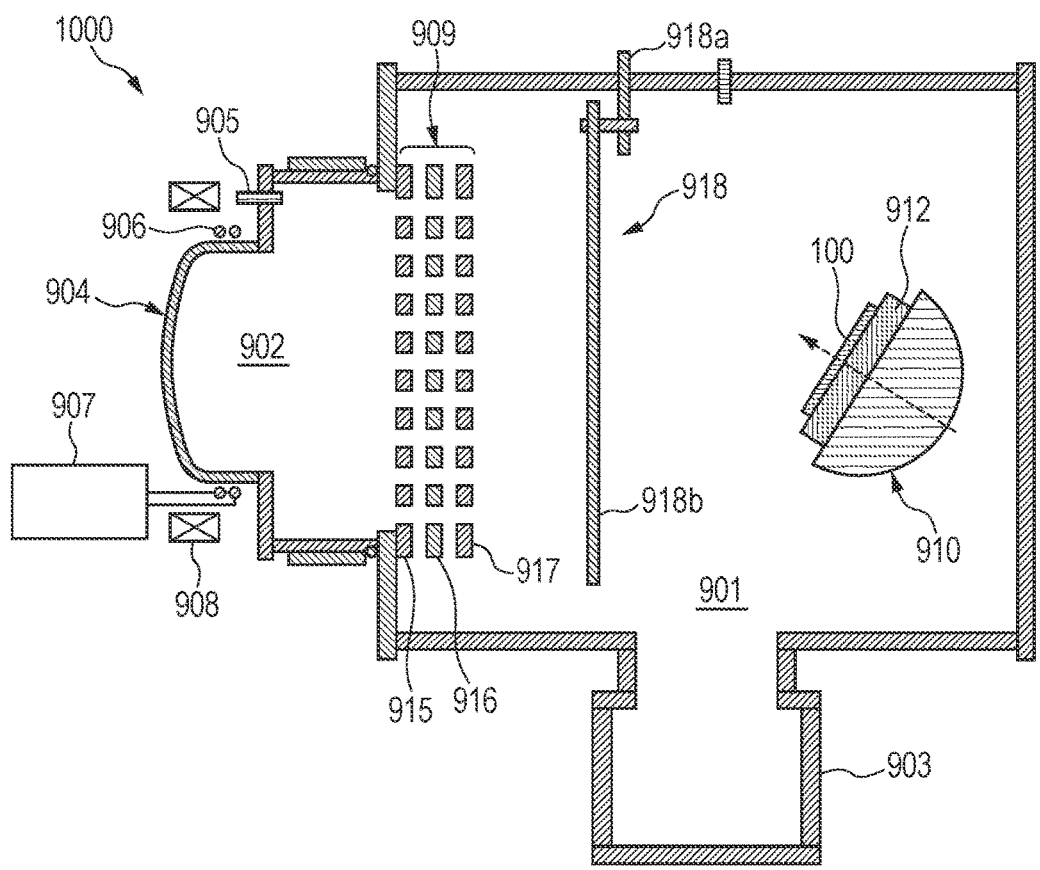
FIG. 12 is a schematic configuration diagram of a substrate processing apparatus in one embodiment of the present invention.

FIG. 12 is a schematic configuration diagram of a substrate processing apparatus 1000 in the embodiment. The same members and members having the same function as those in the substrate processing apparatus 900 described in the first embodiment are denoted by the same reference numerals and description thereof is omitted. The substrate processing apparatus 1000 is different from the substrate processing apparatus 900 in the first embodiment in that the substrate processing apparatus 1000 includes a shutter 918. The shutter 918 includes a drive mechanism 918a and a shutter portion 918b. The drive mechanism 918a is configured to be capable of driving the shutter portion 918b between a position where the shutter portion 918b shields the substrate 100 against an ion beam from an ion generation chamber 902 (hereafter, also referred to as first position) and a position where the shutter portion 918b does not shield the substrate 100 against the ion beam from the ion generation chamber 902 (hereafter, also referred to as second position). For example, a motor, an actuator, and the like can be used as the drive mechanism 918a.

A substrate processing method in the embodiment which uses the shutter 918 is described by using the flowchart of FIG. 13. Steps S11 to S13 in the substrate processing method in the embodiment are the same as steps S1 to S3 in the substrate processing method in the first embodiment. Note that the first irradiation step in step S13 is performed with the shutter portion 918b set at the second position.

After the first irradiation step in step S13 is completed, in the embodiment, the drive mechanism 918a is activated to set the shutter portion 918b to the first position, and the shutter 918 thereby shields the substrate 100 against the ion beam (step S14). Then, in this state, the substrate holder 910 is inclined to set the incidence angle of the ion beam from the ion generation chamber 902 on the substrate 100 to a second angle θ2 (step S15). Thereafter, the drive mechanism 918a is activated again to set the shutter portion 918b to the second position, and the shutter 918 stops shielding the substrate 100 against the ion beam (step S16). Upon moving of the shutter portion 918b, the substrate 100 is irradiated with the ion beam from the ion generation chamber 902 with the incidence angle set to the second angle θ2 (step S17).

After step S17, the drive mechanism 918a is activated again to set the shutter portion 918b to the first position (step S18). Then the substrate holder 910 is inclined to set the incidence angle of the ion beam from the ion generation chamber 902 on the substrate 100 to a third angle θ3 (step S19). Thereafter the drive mechanism 918a is activated again to set the shutter portion 918b to the second position and the shutter 918 stops shielding the substrate 100 against the ion beam (step S20). Upon moving of the shutter portion 918b, the substrate 100 is irradiated with the ion beam from the ion generation chamber 902 with the incidence angle set to the third angle θ3 (step S21).

Performing such steps causes the shutter 918 to shield the substrate against the ion beam while the incidence angle of the ion beam transitions from the first angle θ1 to the second angle θ2 and while the incidence angle of the ion beam transitions from the second angle θ2 to the third angle θ3. As a result, the substrate 100 can be irradiated with the ion beam only at the first angle θ1, the second angle θ2, and the third angle θ3 with the state where the ion beam is extracted from the ion generation chamber 902 maintained. Accordingly, more accurate processing of the substrate can be performed. Moreover, since the emission of the ion beam is maintained during the processing of the substrate, i.e. the ion beam is continuously emitted toward the substrate 100, it is possible to suppress variation in the etching rate at an ion beam emission end and an ion beam emission start and suppress emission of an ion beam with low directivity, compared to the case where the emission of the ion beam is temporarily stopped in the middle of the processing of the substrate and then started again.

Note that, in the embodiment, the substrate 100 is shielded against the ion beam by setting the shutter portion 918b between the ion generation chamber 902 and the substrate 100. Alternatively, the substrate 100 may be prevented from being irradiated with the ion beam by generating an electric field between the ion generation chamber 902 and the substrate 100 and changing the traveling direction of the ion beam. In the embodiment, preventing the substrate 100 from being irradiated with the ion beam as described above by using any method is referred to as shielding against the ion beam.

The present invention is not limited to the embodiments described above and various changes can be appropriately made within a scope not departing from the spirit of the present invention.

The invention claimed is:

1. A substrate processing method of a substrate which has a recess portion on a surface and in which a deposition film is formed on an opening portion of the recess portion, the deposition film including an upper deposition film on the surface of the substrate, the upper deposition film including a protruding portion protruding from a side wall portion of the recess portion toward an inside of the recess portion on the opening portion of the recess portion, the substrate processing method comprising:
   a first irradiation step of irradiating the protruding portion with a particle beam in a direction which forms a first angle with a direction perpendicular to an in-plane direction of the substrate, to remove part of the protruding portion in a thickness direction; and
   a second irradiation step of, after the first irradiation step, irradiating the protruding portion with the particle beam in a direction which is closer to perpendicular to the in-plane direction of the substrate than is the first angle and which forms a second angle with the direction perpendicular to the in-plane direction of the substrate, to remove part of the protruding portion that remains in the thickness direction.

2. The substrate processing method according to claim 1, wherein the deposition film is formed in a bottom portion and a side wall portion of the recess portion, in addition to the opening portion.

3. The substrate processing method according to claim 1, wherein the first angle is more than 40° to less than 90°.

4. The substrate processing method according to claim 3, wherein the first angle is 60° to 80°.

5. The substrate processing method according to claim 1, wherein the second angle is 0° to less than 45°.

6. The substrate processing method according to claim 5, wherein the second angle is 0° to 20°.

7. The substrate processing method according to claim 1, wherein the deposition film contains a metal element.

8. The substrate processing method according to claim 7, wherein the deposition film functions as a diffusion preventing film.

9. The substrate processing method according to claim 7, wherein the deposition film contains at least one of Al and Ti.

10. The substrate processing method according to claim 1, wherein the substrate includes a member made of an insulator and the recess portion is formed in the member.

11. The substrate processing method according to claim 1, wherein the particle beam includes neutral particles.

12. The substrate processing method according to claim 1, wherein:
the particle beam is emitted continuously toward the substrate after the first irradiation step up to a start of the second irradiation step; and
the substrate processing method further comprises:
a step of shielding the substrate against the particle beam after the first irradiation step, before an angle of the substrate to the particle beam is changed from the first angle; and
a step of stopping shielding the substrate against the particle beam after the angle of the substrate to the particle beam is changed from the first angle to the second angle.

13. The substrate processing method according to claim 1, further comprising a third irradiation step of, after the second irradiation step, irradiating the protruding portion with the particle beam in a direction which is closer to parallel to the in-plane direction of the substrate than is the second angle and which forms a third angle with the direction perpendicular to the in-plane direction of the substrate, to remove part of the protruding portion that remains in the thickness direction.

14. A method of manufacturing a semiconductor device including a substrate which has a recess portion on a surface and in which a deposition film is formed on an opening portion of the recess portion, the deposition film including an upper deposition film on the surface of the substrate, the upper deposition film including a protruding portion protruding from a side wall portion of the recess portion toward an inside of the recess portion on the opening portion of the recess portion, the method comprising:
a first irradiation step of irradiating the protruding portion with a particle beam in a direction which forms a first angle with a direction perpendicular to an in-plane direction of the substrate, to remove part of the protruding portion in a thickness direction; and
a second irradiation step of, after the first irradiation step, irradiating the protruding portion with the particle beam in a direction which is closer to perpendicular to the in-plane direction of the substrate than is the first angle and which forms a second angle with the direction perpendicular to the in-plane direction of the substrate, to remove part of the protruding portion that remains in the thickness direction.

15. The method according to claim 14, further comprising a step of, after the first irradiation step and the second irradiation step, forming a second deposition film covering at least part of the surface of the substrate and an inner wall surface of the recess portion.

16. A substrate processing method of a substrate which has a recess portion on a surface and in which a deposition film is formed on an opening portion of the recess portion, the deposition film including a protruding portion protruding from a side wall portion of the recess portion toward an inside of the recess portion, the substrate processing method comprising:
a first irradiation step of irradiating the deposition film formed on the opening portion with a particle beam in a direction which forms a first angle with a direction perpendicular to an in-plane direction of the substrate, to remove part of the deposition film in a thickness direction; and
a second irradiation step of, after the first irradiation step, irradiating the deposition film formed on the opening portion with the particle beam in a direction which is closer to perpendicular to the in-plane direction of the substrate than is the first angle and which forms a second angle with the direction perpendicular to the in-plane direction of the substrate, to remove part of the deposition film that remains in the thickness direction,
wherein the first irradiation step reduces a thickness of the protruding portion in the direction perpendicular to the in-plane direction of the substrate, and the second irradiation step reduces a thickness of the protruding portion in a direction parallel to the substrate.

17. A method of manufacturing a semiconductor device including a substrate which has a recess portion on a surface and in which a deposition film is formed on an opening portion of the recess portion, the deposition film including a protruding portion protruding from a side wall portion toward an inside of the recess portion, the method comprising:
a first irradiation step of irradiating the deposition film formed on the opening portion with a particle beam in a direction which forms a first angle with a direction perpendicular to an in-plane direction of the substrate, to remove part of the deposition film in a thickness direction; and
a second irradiation step of, after the first irradiation step, irradiating the deposition film formed on the opening portion with the particle beam in a direction which is closer to perpendicular to the in-plane direction of the substrate than is the first angle and which forms a second angle with the direction perpendicular to the in-plane direction of the substrate, to remove part of the deposition film that remains in the thickness direction,
wherein the first irradiation step reduces a thickness of the protruding portion in the direction perpendicular to the in-plane direction of the substrate, and the second irradiation step a thickness of the protruding portion in a direction parallel to the substrate.

* * * * *